United States Patent
Behera et al.

(10) Patent No.: US 10,074,534 B2
(45) Date of Patent: Sep. 11, 2018

(54) ULTRA-CONFORMAL CARBON FILM DEPOSITION

(71) Applicant: Applied Materials, Inc., Santa Clara, CA (US)

(72) Inventors: Swayambhu P. Behera, Santa Clara, CA (US); Shahid Shaikh, Santa Clara, CA (US); Pramit Manna, Sunnyvale, CA (US); Mandar B. Pandit, Milpitas, CA (US); Tersem Summan, San Jose, CA (US); Patrick Reilly, Pleasanton, CA (US); Deenesh Padhi, Sunnyvale, CA (US); Bok Hoen Kim, San Jose, CA (US); Heung Lak Park, San Jose, CA (US); Derek R. Witty, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/636,239

(22) Filed: Jun. 28, 2017

(65) Prior Publication Data

US 2017/0301537 A1 Oct. 19, 2017

Related U.S. Application Data

(62) Division of application No. 14/770,412, filed as application No. PCT/US2014/016604 on Feb. 14, 2014, now Pat. No. 9,721,784.

(Continued)

(51) Int. Cl.
*H01L 21/02* (2006.01)
*H01L 21/033* (2006.01)
(Continued)

(52) U.S. Cl.
CPC ........ *H01L 21/02115* (2013.01); *C23C 16/26* (2013.01); *C23C 16/50* (2013.01);
(Continued)

(58) Field of Classification Search
CPC .......................... H01L 21/02115; C23C 16/50
See application file for complete search history.

(56) References Cited

U.S. PATENT DOCUMENTS

| | | |
|---|---|---|
| 4,882,256 A | 11/1989 | Osawa et al. |
| 6,316,169 B1 | 11/2001 | Vahedi et al. |

(Continued)

FOREIGN PATENT DOCUMENTS

| | | |
|---|---|---|
| JP | 5637212 B2 | 12/2014 |
| KR | 10-2009-0018725 | 2/2009 |

OTHER PUBLICATIONS

International Search Report and Written Opinion, PCT/US2014/016604, dated May 30, 2014.

(Continued)

*Primary Examiner* — Moazzam Hossain
*Assistant Examiner* — Long H Le
(74) *Attorney, Agent, or Firm* — Patterson + Sheridan LLP

(57) ABSTRACT

Embodiments of the disclosure relate to deposition of a conformal carbon-based material. In one embodiment, the method comprises depositing a sacrificial dielectric layer over a substrate, forming patterned features on the substrate by removing portions of the sacrificial dielectric layer to expose an upper surface of the substrate, introducing a hydrocarbon source, a plasma-initiating gas, and a dilution gas into the processing chamber, generating a plasma in the processing chamber at a deposition temperature of about 80° C. to about 550° C. to deposit a conformal amorphous carbon layer on the patterned features and the exposed upper (Continued)

surface of the substrate, selectively removing the amorphous carbon layer from an upper surface of the patterned features and the upper surface of the substrate using an anisotropic etching process to provide the patterned features filled within sidewall spacers, and removing the patterned features formed from the sacrificial dielectric layer.

9 Claims, 6 Drawing Sheets

Related U.S. Application Data

(60) Provisional application No. 61/793,979, filed on Mar. 15, 2013.

(51) Int. Cl.
    *H01L 21/311*     (2006.01)
    *C23C 16/26*     (2006.01)
    *C23C 16/50*     (2006.01)

(52) U.S. Cl.
    CPC .... *H01L 21/02274* (2013.01); *H01L 21/0337* (2013.01); *H01L 21/31116* (2013.01)

(56) References Cited

U.S. PATENT DOCUMENTS

| | | | |
|---|---|---|---|
| 6,500,756 B1 | 12/2002 | Bell et al. | |
| 6,596,599 B1 | 7/2003 | Guo | |
| 7,456,062 B1* | 11/2008 | En | H01L 29/6656 257/E21.148 |
| 7,935,464 B2 | 5/2011 | Ngai | |
| 8,435,608 B1 | 5/2013 | Subramonium et al. | |
| 2006/0154477 A1 | 7/2006 | Geng et al. | |
| 2007/0049040 A1 | 3/2007 | Bai et al. | |
| 2008/0122125 A1 | 5/2008 | Zhou | |
| 2008/0311753 A1 | 12/2008 | Zheng et al. | |
| 2009/0061638 A1 | 3/2009 | Yi | |
| 2009/0311634 A1 | 12/2009 | Yue et al. | |
| 2010/0075503 A1 | 3/2010 | Bencher et al. | |
| 2010/0093187 A1 | 4/2010 | Lee et al. | |
| 2010/0136784 A1* | 6/2010 | Mebarki | H01L 21/0337 438/669 |
| 2010/0136792 A1 | 6/2010 | Mebarki et al. | |
| 2010/0291713 A1 | 11/2010 | Lee et al. | |
| 2011/0021026 A1 | 1/2011 | Luning et al. | |
| 2011/0177669 A1 | 7/2011 | Lee et al. | |
| 2011/0241128 A1 | 10/2011 | O'Meara et al. | |
| 2011/0244142 A1 | 10/2011 | Cheng et al. | |
| 2012/0015521 A1* | 1/2012 | Yu | C23C 16/26 438/703 |
| 2013/0189845 A1 | 7/2013 | Kim et al. | |

OTHER PUBLICATIONS

Final Office Action for U.S. Appl. No. 14/371,989 dated Feb. 25, 2015.
International Search Report and Written Opinion for International Application No. PCT/US2016/029746 dated Jul. 19, 2016.
Office Action for U.S. Appl. No. 14/736,848 dated Nov. 5, 2015.
Final Office Action for U.S. Appl. No. 14/736,848 dated May 5, 2016.
Search Report and Office Action for Taiwan Application No. 102102025 dated Apr. 13, 2016.
International Search Report and Written Opinion dated May 15, 2013 for International Application No. PCT/US2013/021769.
Office Action for U.S. Appl. No. 13/354,129 dated Jun. 7, 2013.
Final Office Action for U.S. Appl. No. 13/354,129 dated Dec. 31, 2013.
International Preliminary Report on Patentability for International Application No. PCT/US13/021769 dated Jul. 31, 2014.
Office Action for U.S. Appl. No. 14/371,989 dated Dec. 3, 2014.
Office Action for U.S. Appl. No. 14/770,412 dated Jun. 16, 2016.
Office Action for U.S. Appl. No. 14/770,412 dated Jan. 18, 2017.

\* cited by examiner

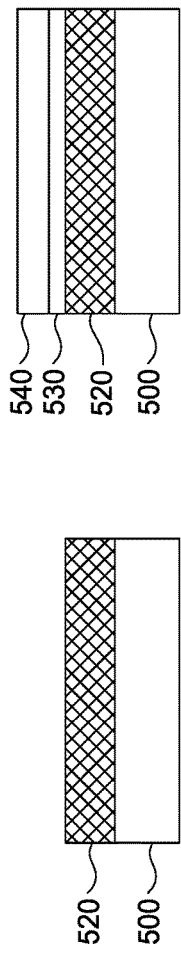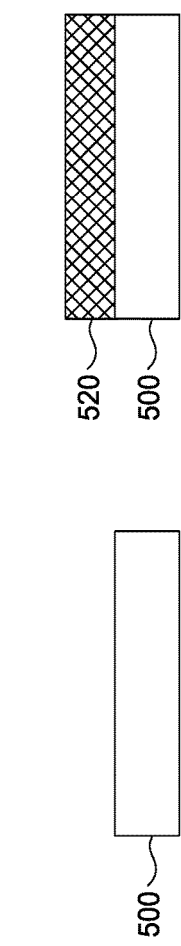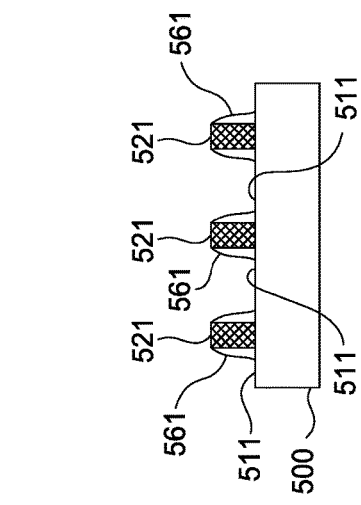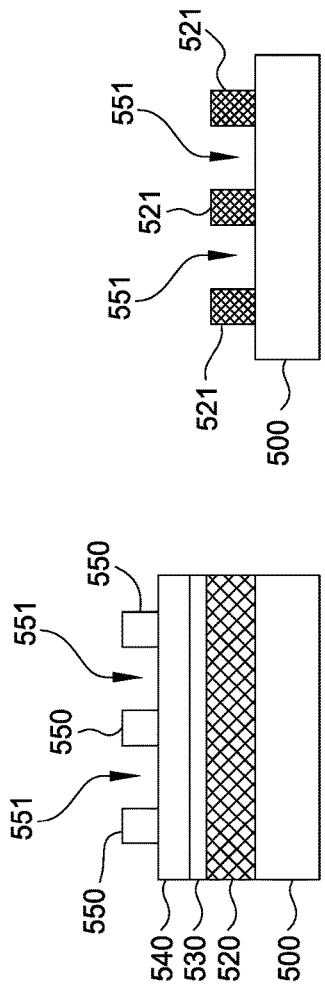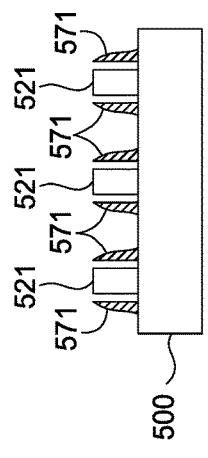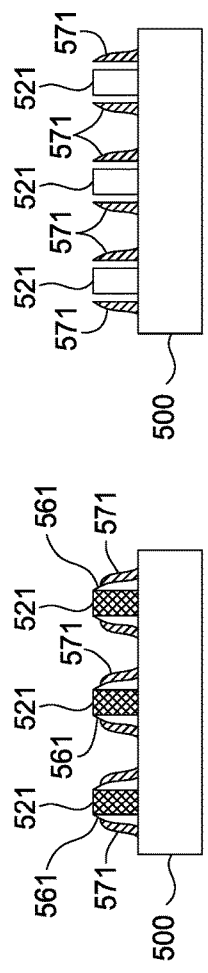

ULTRA-CONFORMAL CARBON FILM DEPOSITION

CROSS-REFERENCE TO RELATED APPLICATIONS

This application is a divisional application of U.S. patent application Ser. No. 14/770,412, filed Aug. 25, 2015, which is a National Stage entry of International Patent Application Serial No. PCT/US2014/016604, filed Feb. 14, 2014, which claims benefit of U.S. provisional patent application Ser. No. 61/793,979, filed Mar. 15, 2013, each of which are herein incorporated by reference.

BACKGROUND

Field

Embodiments of the present disclosure generally relate to the fabrication of integrated circuits and particularly to a method for protecting sidewalls of hard mask spacers during an etching process.

Description of the Related Art

Reducing the size of integrated circuits (ICs) results in improved performance, increased capacity and/or reduced cost. Each size reduction requires more sophisticated techniques to form the ICs. Photolithography is commonly used to pattern ICs on a substrate. An exemplary feature of an IC is a line of a material which may be a metal, semiconductor or insulator. Linewidth is the width of the line and the spacing is the distance between adjacent lines. Pitch is defined as the distance between a same point on two adjacent lines. The pitch is equal to the sum of the linewidth and the spacing. Due to factors such as optics and light or radiation wavelength, however, photolithography techniques have a minimum pitch below which a particular photolithographic technique may not reliably form features. Thus, the minimum pitch of a photolithographic technique can limit feature size reduction.

Double patterning processes are widely employed in the patterning of 3x and beyond features. Self-aligned double patterning (SADP) is one double patterning process used for extending the capabilities of photolithographic techniques beyond the minimum pitch. Such a method is illustrated in FIGS. 1A-1F. With reference to FIG. 1A, patterned core features 102 are formed from sacrificial structural material above a dielectric layer 114 on a substrate 100 using standard photo-lithography and etching techniques. The patterned features are often referred to as placeholders or cores and have linewidths and/or spacings near the optical resolution of a photolithography system using a high-resolution photomask. As shown in FIG. 1B, a conformal layer 106 of hard mask material is subsequently deposited over core features 102. Hard mask spacers 108 are then formed on the sides of core features 102 by preferentially etching the hard mask material from the horizontal surfaces with an anisotropic plasma etch to open the hard mask material deposited on top of the patterned core features 102 as well as remove the hard mask material deposited at the bottom between the two sidewalls, as shown in FIG. 10. The patterned core features 102 may then be removed, leaving behind hard mask spacers 108 (FIG. 1D). At this point hard mask spacers 108 may be used as an etch mask for transferring the pattern to the dielectric layer 114 to form dielectric ribs 116, as shown in FIG. 1E. The hard mask spacers 108 are subsequently removed (FIG. 1F). Therefore, the density of the dielectric ribs 116 is twice that of the photolithographically patterned core features 102, and the pitch of the dielectric ribs 116 is half the pitch of the patterned core features 102.

Currently, hard mask spacers 108 are formed by an atomic layer deposition (ALD) using an etchable material such as silicon oxides. These oxides are typically deposited at very low temperature (e.g., less than 200° C.). As a result, these hard mask spacers are not compatible for high temperature application. In addition, the deposited material quality is poor, with low density and poor mechanical strength and degraded chemical resistance to subsequent etching chemistries. Moreover, oxides spacer materials require wet clean process for removal after etching. Wet clean is an isotropic process which typically leads to CD loss and under-cut issues. Therefore, a dry-strippable spacer material is highly desirable.

Amorphous carbon has been a decent alternative for etch hard mask material due to its easy strippability using conventional dry ashing process. This enables selective removal of carbon films without affecting other surrounding materials such as $SiO_2$, SiN, etc. One of the major challenges in amorphous carbon deposition is to achieve conformality with minimum pattern loading effect, gap filling and planarization capabilities on high aspect ratio structures.

Therefore, there is a need for an improved method of depositing highly conformal amorphous carbon film with minimal or no pattern micro-loading while preserving the mechanical properties such as density, hardness and modulus.

SUMMARY

Embodiments of the present disclosure relate to deposition of an ultra-conformal carbon-based material. In one embodiment, the method comprises depositing a sacrificial dielectric layer with a predetermined thickness over a substrate, forming patterned features on the substrate by removing portions of the sacrificial dielectric layer to expose an upper surface of the substrate, introducing a hydrocarbon source, a plasma-initiating gas, and a dilution gas into the processing chamber, wherein a volumetric flow rate of hydrocarbon source:plasma-initiating gas:dilution gas is in a ratio of 1:5:20, generating a plasma in the processing chamber at a deposition temperature of about 80° C. to about 550° C. to deposit a conformal amorphous carbon layer on the patterned features and the exposed upper surface of the substrate, selectively removing the amorphous carbon layer from an upper surface of the patterned features and the upper surface of the substrate using an anisotropic etching process to provide the patterned features filled within sidewall spacers formed from the conformal amorphous carbon layer, and removing the patterned features formed from the sacrificial dielectric layer.

In another embodiment, a method of forming a conformal amorphous carbon layer on a substrate in a processing chamber is provided. The method comprising forming patterned features on an upper surface of a substrate, depositing a conformal sacrificial dielectric layer on the patterned features and an exposed upper surface of the substrate, selectively removing the sacrificial dielectric layer from an upper surface of the patterned features and the exposed upper surface of the substrate to provide the patterned features filled within first sidewall spacers formed from the sacrificial dielectric layer, forming second sidewall spacers adjacent or in contact with the first sidewall spacers, comprising introducing a hydrocarbon source, a plasma-initiating gas, and a dilution gas into the processing chamber, wherein a volumetric flow rate of hydrocarbon source:plasma-initiating gas:dilution gas is in a ratio of 1:0.5:20, generating a plasma in the processing chamber at a deposition temperature of about 80° C. to about 550° C. to deposit a conformal amorphous carbon layer on the patterned features and the exposed upper surface of the substrate, and selectively removing the amorphous carbon layer from the upper surface of the patterned features and the upper surface of the substrate using an anisotropic etching process, and removing the patterned features filled within the first sidewall spacers.

In yet another embodiment, the method includes depositing a dielectric layer on a substrate, depositing a sacrificial dielectric layer on an upper surface of the dielectric layer, forming a pattern into the sacrificial dielectric layer by removing portions of the sacrificial dielectric layer to expose portions of the upper surface of the dielectric layer, introducing a hydrocarbon source, a nitrogen-containing gas, a plasma-initiating gas, and a dilution gas into the processing chamber, wherein a volumetric flow rate of hydrocarbon source:nitrogen-containing gas:plasma-initiating gas:dilution gas is in a ratio of about 1:0.5:0.5:20, generating a plasma in the processing chamber at a deposition temperature of about 75° C. to about 650° C., a chamber pressure of about 2 Torr to about 15 Torr, and an electrode spacing of about 200 mils to about 1000 mils to deposit a conformal amorphous carbon layer on the portions of the upper surface of the dielectric layer and on remaining portions of the sacrificial dielectric layer, wherein the plasma is generated by applying RF power at a power density to substrate surface area from about 0.04 W/cm$^2$ to about 0.07 W/cm$^2$, selectively removing the amorphous carbon layer using an anisotropic etching process to expose upper surfaces of the remaining portions of the sacrificial dielectric layer and to expose the upper surface of the dielectric layer, and removing the remaining portions of the sacrificial dielectric layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 5A-5H illustrate cross-sectional views of a structure formed by the flowchart set forth in FIG. 4.

DETAILED DESCRIPTION

Embodiments of the present disclosure relate to deposition of an ultra-conformal carbon-based material. In various embodiments, an ultra-conformal carbon-based material, such as amorphous carbon, is deposited over features of sacrificial structure material patterned using a high-resolution photomask. In one example, the ultra-conformal carbon-based material serves as a protective layer during an ashing or etching process, leaving the sacrificial structure material with an upper surface exposed and sidewalls protected by the carbon-based spacers. Upon removal of the sacrificial structure material, the remaining carbon-based spacers may perform as a hardmask layer for etching the underlying layer or structure. While the process described herein is mainly related to a spacer application using carbon-based material, the improved process of the disclosure is also applicable to other applications which may require a conformal amorphous carbon film such as gap fill, hard mask for hot ion implantation, feature hole shrinking or protection for semiconductor devices, or healing of line edge roughness for device nodes.

Embodiments of the present disclosure may be performed using any suitable processing chamber such as a plasma enhanced chemical vapor deposition (PECVD) chamber. The processing chamber may be incorporated into a substrate processing system. An exemplary substrate processing system that may be used to practice the disclosure is described in commonly assigned U.S. Pat. No. 6,364,954 issued on Apr. 2, 2002, to Salvador et. al. and is herein incorporated by reference. Examples of suitable systems include the CENTURA® systems which may use a DxZ™ processing chamber, PRECISION 5000® systems, PRODUCER™ systems, PRODUCER GT™ and the PRODUCER SE™ processing chambers which are commercially available from Applied Materials, Inc., Santa Clara, Calif. It is contemplated that other deposition processing system, including those available from other manufacturers, may be adapted to practice the embodiments described herein.

Figure 1A:
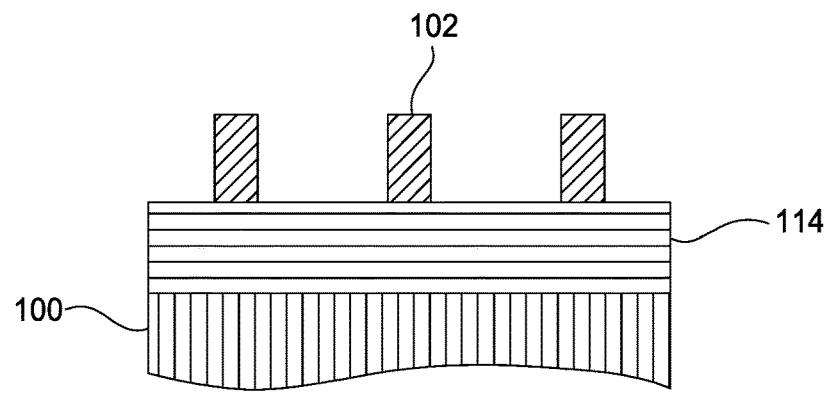
FIGS. 1A-1F illustrate cross-sectional views representing a conventional double patterning process.
Figure 1B:
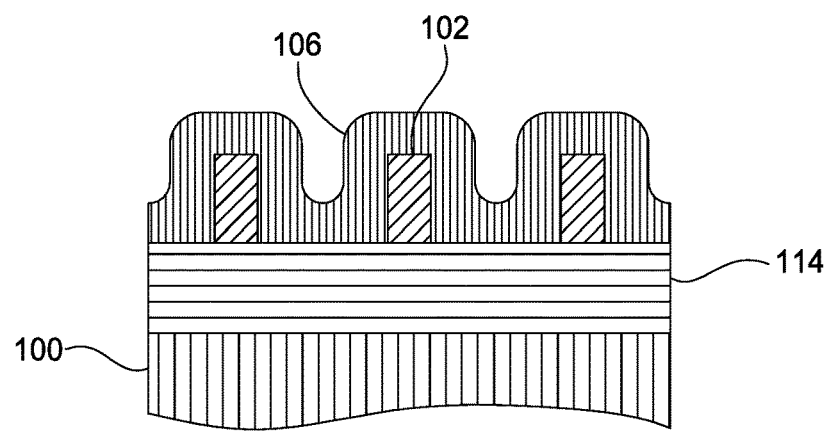
Figure 1C:
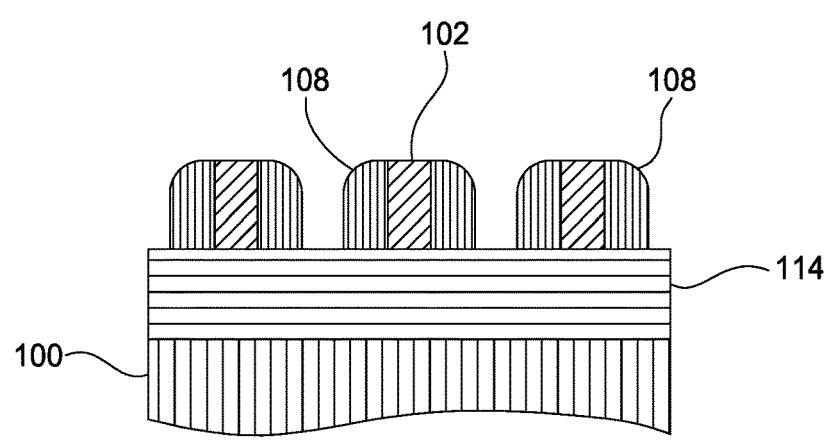
Figure 1D:
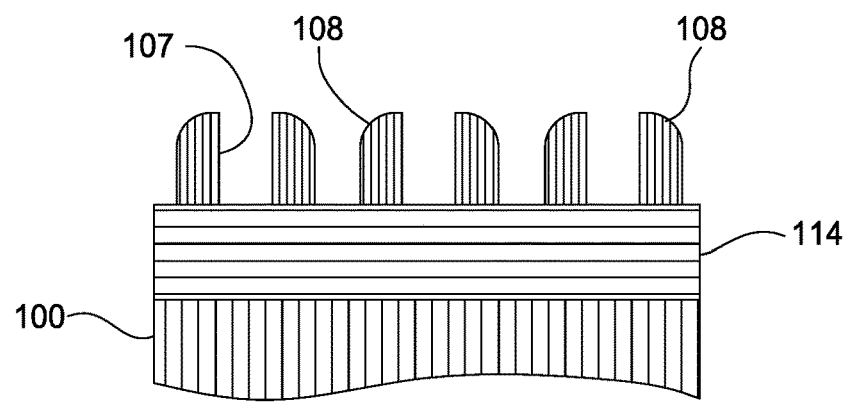
Figure 1E:
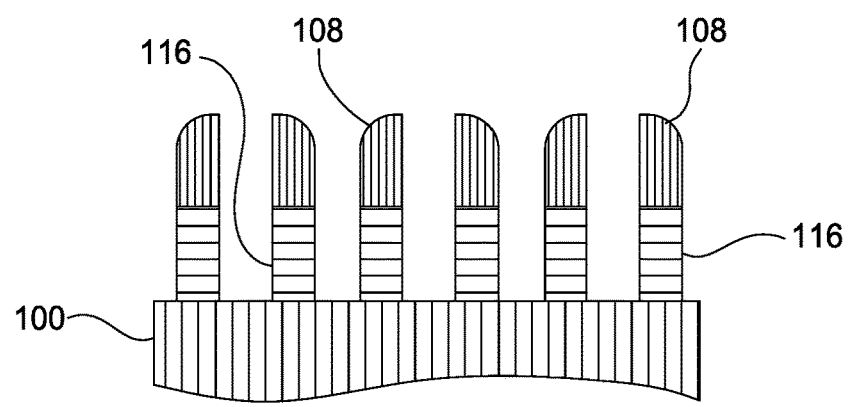
Figure 1F:
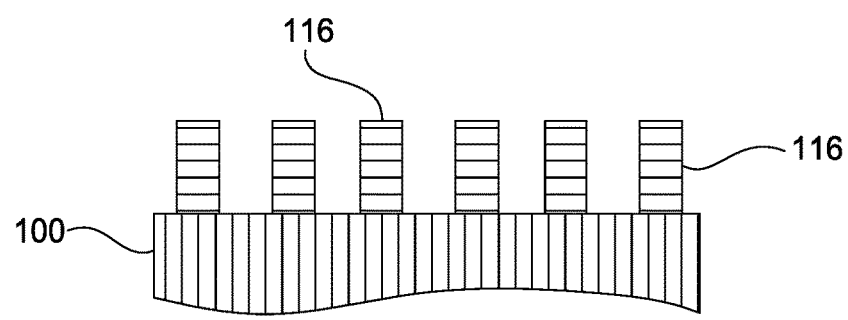
Figure 2:
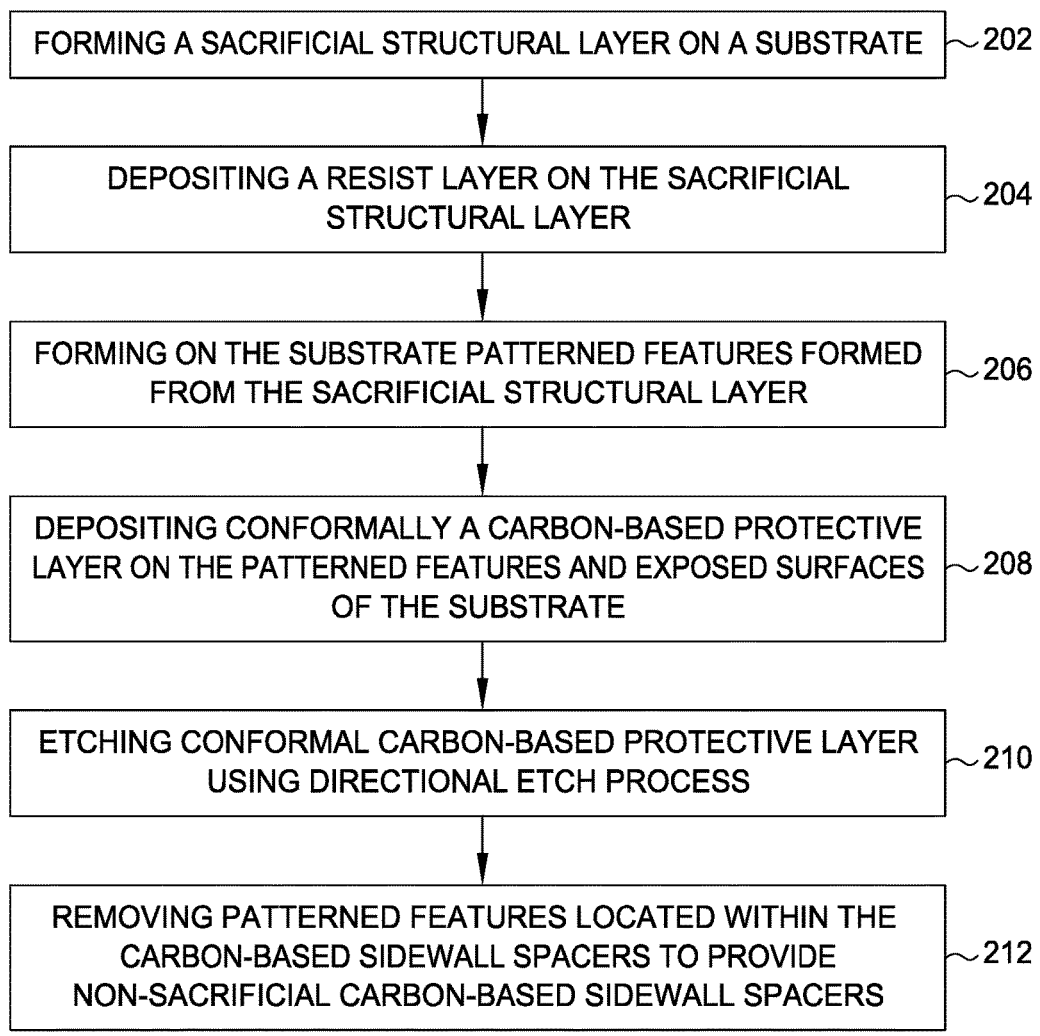
FIG. 2 is a flowchart depicting steps associated with an exemplary patterning process according to one embodiment of the disclosure.

FIG. 2 is a process flowchart depicting steps associated with an exemplary self-aligned double patterning (SADP) process according to one embodiment of the disclosure. FIGS. 3A-3E illustrate cross-sectional views of a structure formed by the steps set forth in FIG. 2. It is contemplated that the self-aligned double patterning process is chosen for illustration purpose. The concept of the disclosure is equally applicable to other deposition processes or patterning schemes, such as a self-aligned triple patterning (SATP) process, a self-aligned quadruple patterning (SAQP) process, a via/hole shrink process, a back end of line (BEOL), etc., that may require the use of protective spacer or protective sacrificial layer, as needed in various semiconductor processes such as NAND flash application, DRAM application, or CMOS application, etc.

The process 200 starts at box 202 by forming a sacrificial structural layer 320 on a substrate 300. The sacrificial structural layer 320 may be a silicon-based material such as silicon oxide, silicon nitride, silicon oxynitride, silicon carbides, or polysilicon. It is contemplated that the choice of materials used for the sacrificial structural layer 320 may vary depending upon the etching/ashing rate relative to the conformal protective layer to be formed thereon.

While not shown, one or more anti-reflective coating layers may be deposited on the sacrificial structural layer 320 to control the reflection of light during a lithographic patterning process. Suitable anti-reflective coating layer may include silicon dioxide, silicon oxynitride, silicon nitride, or combinations thereof. One exemplary anti-reflective coating layer may be a DARC™ material commercially available from Applied Materials, Inc. of Santa Clara, Calif.

The substrate 300 may have a substantially planar surface 323 as shown. Alternatively, the substrate 300 may have patterned structures, a surface having trenches, holes, or vias formed therein. While the substrate 300 is illustrated as a single body, the substrate 300 may contain one or more materials used in forming semiconductor devices such as metal contacts, trench isolations, gates, bitlines, or any other interconnect features. In one embodiment, the substrate 300 may include one or more metal layers, one or more dielectric materials, semiconductor material, and combinations thereof utilized to fabricate semiconductor devices. For example, the substrate 300 may include an oxide material, a nitride material, a polysilicon material, or the like, depending upon application. In cases where a memory application is desired, the substrate 300 may include the silicon substrate material, an oxide material, and a nitride material, with or without polysilicon sandwiched in between.

In some embodiments, the substrate 300 may include a plurality of alternating oxide and nitride materials (i.e., oxide-nitride-oxide (ONO)), one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or updoped amorphous silicon alternating with doped amorphous silicon deposited on a surface of the substrate (not shown). The substrate 300 may be a material or a layer stack comprising one or more of the following: crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof.

Figure 3A:
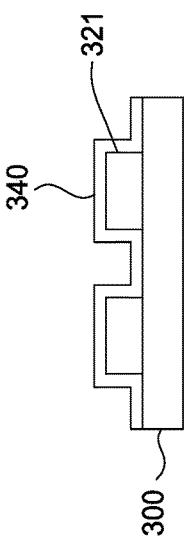
FIGS. 3A-3E illustrate cross-sectional views of a structure formed by the flowchart set forth in FIG. 2.

At box 204, a resist layer 330, such as a photoresist material, is deposited on the sacrificial structural layer 320 and patterned with a desired pitch as shown in FIG. 3A.

Figure 3B:
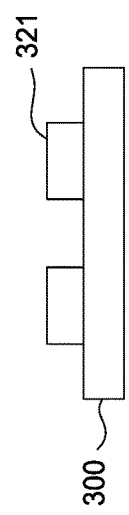

At box 206, patterned features 321 formed from the sacrificial structural layer 320 are produced on the substrate 300, using the resist layer 330 as a mask, by standard photo-lithography and etching techniques, as shown in FIG. 3B. The patterned features are sometimes referred to as placeholders, mandrels or cores and have specific linewidth and/or spacing based upon the photoresist material used. The width of the patterned features 321 may be adjusted by subjecting the resist layer 330 to a trimming process. After the pattern has been transferred into the sacrificial structural layer 320, any residual photoresist and hard mask material (if used) are removed using a suitable photoresist stripping process.

Figure 3C:
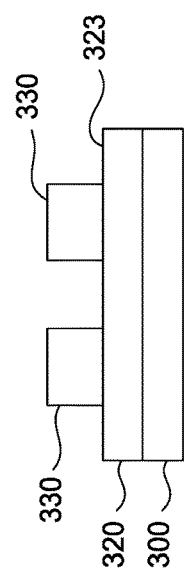

At box 208, a carbon-based protective layer 340 is deposited conformally or substantially conformally on the patterned features 321 and the exposed surfaces of the substrate 300, as shown in FIG. 3C. The carbon-based protective layer 340, when deposited using novel process conditions discussed below, will achieve step coverage of at least about 80% or more, for example about 100% or more, such as 120%. The thickness of the carbon-based protective layer 340 may be between about 5 Å and about 200 Å. In one embodiment, the carbon-based protective layer is an amorphous carbon (a-C) layer. The amorphous carbon may be undoped or doped with nitrogen. In one example, the carbon-based protective layer 340 is a nitrogen-doped amorphous carbon layer. The nitrogen-doped amorphous carbon layer may be deposited by any suitable deposition techniques such as plasma enhanced chemical vapor deposition (PECVD) process. In one embodiment, the nitrogen-doped amorphous carbon layer may be deposited by flowing, among others, a hydrocarbon source, a nitrogen-containing gas such as $N_2$ or $NH_3$, a plasma-initiating gas, and a dilution gas into a PECVD chamber. In another embodiment, the nitrogen-doped amorphous carbon layer may be deposited by flowing, among others, a hydrocarbon source, a nitrogen-containing hydrocarbon source, a plasma-initiating gas, and a dilution gas into a PECVD chamber. In yet another embodiment, a nitrogen-containing hydrocarbon source, a plasma-initiating gas, and a dilution gas are flowed into the PECVD chamber to form the nitrogen-doped amorphous carbon protective layer on the patterned features 321 and the exposed surfaces of the substrate 300.

The hydrocarbon source may be a mixture of one or more hydrocarbon compounds. The hydrocarbon source may include a gas-phase hydrocarbon compound and/or a gas mixture including vapors of a liquid-phase hydrocarbon compound and a carrier gas, as will be further discussed below. The plasma-initiating gas may be helium since it is easily ionized; however, other gases, such as argon, may also be used. The dilution gas may be an easily ionized, relatively massive, and chemically inert gas such as argon, krypton, xenon. In some cases, additional hydrogen dilution can be introduced to further increase the film density, as will be discussed later.

The hydrocarbon compounds may be partially or completely doped derivatives of hydrocarbon compounds, including fluorine-, oxygen-, hydroxyl group-, and boron-containing derivatives of hydrocarbon compounds. The hydrocarbon compounds may contain nitrogen or be deposited with a nitrogen-containing gas, such as ammonia, or the hydrocarbon compounds may have substituents such as fluorine and oxygen. Generally, hydrocarbon compounds or derivatives thereof that may be included in the hydrocarbon source may be described by the formula $C_xH_y$, where x has a range of between 1 and 20, and y has a range of between 1 and 20. In another embodiment, the hydrocarbon compounds or derivatives thereof that may be included in the hydrocarbon source may be described by the formula $C_xH_yF_z$, where x has a range of between 1 and 24, y has a range of between 0 and 50, and z has a range of 0 to 50, and the ratio of x to y+c is 1:2 or greater. In yet another embodiment, the hydrocarbon source may be described by the formula $C_aH_bO_cF_dN_e$ for oxygen and/or nitrogen substituted compounds, where a has a range of between 1 and 24, b has a range of between 0 and 50, c has a range of 0 to 10, d has a range of 0 to 50, e has a range of 0 to 10, and the ratio of a to b+c+d+e is 1:2 or greater.

Suitable hydrocarbon compounds include one or more of the following compounds, for example, alkanes such as methane ($CH_4$), ethane ($C_2H_6$), propane ($C_3H_8$), butane ($C_4H_{10}$) and its isomer isobutane, pentane ($C_5H_{12}$) and its isomers isopentane and neopentane, hexane ($C_6H_{14}$) and its isomers 2-methylpentance, 3-methylpentane, 2,3-dimethylbutane, and 2,2-dimethyl butane, and so on. Additional suitable hydrocarbons may include alkenes such as ethylene, propylene, butylene and its isomers, pentene and its isomers, and the like, dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like. Also, alkynes such as acetylene ($C_2H_2$), propyne ($C_3H_4$), butyne ($C_4H_6$), vinylacetylene and derivatives thereof can be used as carbon precursors. Additionally cyclic hydrocarbons, such as benzene, styrene, toluene, xylene, ethylbenzene, acetophenone, methyl benzoate, phenyl acetate, phenylacetylene ($C_8H_6$), phenol, cresol, furan, alpha-terpinene, cymene, 1,1,3,3,-tetramethylbutylbenzene, t-butylether, t-butylethylene, methyl-methacrylate, and t-butylfurfuryl-ether, compounds having the formula $C_3H_2$ and $C_5H_4$, halogenated aromatic compounds including monofluorobenzene, difluorobenzenes, tetrafluorobenzenes, hexafluorobenzene and the like can be used. Halogenated hydrocarbons such as carbon tetrachloride ($CCl_4$), diiodomethane ($CH_2I_2$), chlorofluorocarbon (CFC), bromotrichloromethane ($BrCCl_3$), 1,1-dichloroethylene, bromobenzene, or derivatives thereof may also be used.

Examples of suitable derivatives of hydrocarbon compounds may include, but not limited to fluorinated alkanes, halogenated alkanes, and halogenated aromatic compounds. Fluorinated alkanes may include, but not limited to monofluoromethane, difluoromethane, trifluoromethane, tetrafluoromethane, monofluoroethane, tetrafluoroethanes, pentafluoroethane, hexafluoroethane, monofluoropropanes, trifluoropropanes, pentafluoropropanes, perfluoropropane, monofluorobutanes, trifluorobutanes, tetrafluorobutanes, octafluorobutanes, difluorobutanes, monofluoropentanes, pentafluoropentanes, tetrafluorohexanes, tetrafluoroheptanes, hexafluoroheptanes, difluorooctanes, pentafluorooctanes, difluorotetrafluorooctanes, monofluorononanes, hexafluorononanes, difluorodecanes, pentafluorodecanes, and the like. Halogenated alkenes may include, but not limited to monofluoroethylene, difluoroethylenes, trifluoroethylene, tetrafluoroethylene, monochloroethylene, dichloroethylenes, trichloroethylene, tetrachloroethylene, and the like. Halogenated aromatic compounds may include, but not limited to monofluorobenzene, difluorobenzenes, tetrafluorobenzenes, hexafluorobenzene and the like.

Nitrogen-containing hydrocarbon compounds or derivatives thereof that may be included in the nitrogen-containing hydrocarbon source can be described by the formula CxHyNz, where x has a range of between 1 and 12, y has a range of between 2 and 20, and z has a range of between 1 and 10. Suitable nitrogen containing hydrocarbon compounds may include one or more of the following compounds methylamine, dimethylamine, trimethylamine (TMA), triethylamine, quinoline, imidazole, vinyl imidazole, acetonitrile, acrylonitrile, aniline, pyrrole, pyridine, piperidine, and benzonitrile.

In certain embodiments, oxygen-containing hydrocarbons compounds such as benzaldehyde, acetophenone, anisole, diethyl ether, acetone, methanol, ethanol, isopropanol, ethanolamine, cresol, morpholine, or divinyl ether may also be used in the deposition of amorphous carbon film.

The plasma-initiating gas may be introduced into the PECVD chamber at before and/or same time as the hydrocarbon compound and a plasma is initiated to begin deposition. The plasma-initiating gas may be a high ionization potential gas including, and not limited to, helium gas, hydrogen gas, nitrogen gas, argon gas and combinations thereof. The plasma-initiating gas may also be a chemically inert gas, such as helium gas, nitrogen gas, or argon gas. Suitable ionization potentials for gases are from about 5 eV (electron potential) to 25 eV. The plasma-initiating gas may be introduced into the PECVD chamber prior to the nitrogen containing hydrocarbon source and/or the hydrocarbon source, which allows a stable plasma to be formed and reduces the chances of arcing.

An inert gas is typically used as a dilution gas or a carrier gas to flow with the hydrocarbon source, the plasma-initiating gas, the nitrogen containing hydrocarbon source, or combinations thereof. Suitable dilution gases may include argon (Ar), helium (He), hydrogen ($H_2$), nitrogen ($N_2$), ammonia ($NH_3$), noble gas such as krypton, xenon, or any combinations thereof. In one example, argon is used as the dilution gas for reasons of economy. Ar, He, and $N_2$ may be used to control the density and deposition rate of the amorphous carbon layer. In some cases, the addition of $H_2$ and/or $NH_3$ can be used to control the hydrogen ratio of the amorphous carbon layer. In cases where alkynes such as acetylene ($C_2H_2$) or alkenes such as propylene is used as hydrocarbon source, the carrier gas may not be used during the deposition.

Conformality of amorphous carbon can be optimized by choice of precursors and deposition conditions. In general, precursors with lower H:C ratio (<1:1 ratio) yield higher conformality. Exemplary process conditions for deposition of a conformal amorphous carbon film are described below.

A hydrocarbon source, a nitrogen-containing gas and a dilution gas may be introduced into a PECVD chamber to deposit a nitrogen-doped amorphous carbon. The hydrocarbon source may be any suitable hydrocarbon compound as discussed above. If a liquid hydrocarbon source is used, the precursor flow may be between about 50 mg/min to about 1000 mg/min. If a gaseous hydrocarbon source is used, the precursor flow may be between about 100 sccm to about 5000 sccm, for example about 200 sccm to about 600 sccm. If a carrier gas is used, the carrier flow may be between about 500 sccm and about 10000 sccm. The plasma-initiating gas may be any suitable plasma-initiating gas as discussed above, and flowed at a flow rate from about 0 sccm to about 50,000 sccm, for example, between about 400 sccm to about 8,000 sccm. The dilution gas may be any dilution gas as described above and supplied at a flow rate from about 0 sccm to about 5,000 sccm, for example about 500 sccm to about 1,000 sccm.

In various embodiments, the nitrogen-containing gas may be introduced at a nitrogen-containing gas to hydrocarbon source ratio of about 1:100 to about 20:1, for example about 1:40 to about 10:1. The dilution gas may be introduced at a dilution gas to hydrocarbon source ratio of about 2:1 to about 40:1, for example about 20:1 to about 30:1. In one embodiment, a volumetric flow rate of hydrocarbon source: nitrogen-containing gas:plasma-initiating gas:dilution gas is in a ratio of, for example about 1:1:0.5:20, for example about 1:0.5:0.5:20, for example about 1:0.2:0.5:20, for example about 1:0.2:0.5:30, for example about 1:0.2:0.5:40. In one embodiment, a volumetric flow rate of hydrocarbon source:plasma-initiating gas:dilution gas is in a ratio of about 1:0.5:20 to about 1:10:20, for example about 1:0.8:20, about 1:1:20, about 1:1.5:20, about 1:1.8:20, about 1:2:20, about 1:2.5:20, about 1:3:20, about 1:3.5:20, about 1:4:20, about 1:4.5:20, about 1:5:20, about 1:5.5:20, about 1:6:20, about 1:8:20, about 1:10:20 or above, for example about 1:15:20.

If a nitrogen-containing hydrocarbon source (as described above) is used, the nitrogen-containing hydrocarbon gas may be flowed at a flow rate from about 10 sccm to about 2,000 sccm, for example, from about 500 sccm to about 1,500 sccm. In case the nitrogen-containing hydrocarbon source is a liquid precursor, the nitrogen-containing hydrocarbon source flow can be between 15 mg/min and 2,000 mg/min, for example between 100 mg/min and 1,000 mg/min. In one embodiment, a volumetric flow rate of nitrogen-containing hydrocarbon source: the plasma-initiating gas:dilution gas is in a ratio of, for example about 1:0.5:20, for example about 1:0.2:20, for example about 1:0.8:20, for example about 1:1:20, for example about 1:0.5:30, for example about 1:0.5:40.

During the deposition, the substrate temperature may be maintained between about 75° C. to about 650° C., for example between about 80° C. and about 550° C., such as between about 300° C. and about 480° C., in order to minimize the coefficient of absorption of the resultant film. The process chamber may be maintained at a chamber pressure about 100 mTorr to about 100 Torr, for example from about 2 Torr to about 15 Torr, for example about 8 Torr or greater, such as about 20 Torr. Plasma may be generated by applying RF power at a power density to substrate surface area of from about 0.001 W/cm$^2$ to about 5 W/cm$^2$, such as from about 0.01 W/cm$^2$ to about 1 W/cm$^2$, for example about 0.04 W/cm$^2$ to about 0.07 W/cm$^2$. The power application may be from about 1 Watt to about 2,000 watts, such as from about 10 W to about 100 W, for a 300 mm substrate. RF power can be either single frequency or dual frequency. A dual frequency RF power application is believed to provide independent control of flux and ion energy since the energy of the ions hitting the film surface influences the film density. The applied RF power and use of one or more frequencies may be varied based upon the substrate size and the equipment used. If a single frequency power is used, the frequency power may be between about 10 KHz and about 30 MHz, for example about 13.56 MHz or greater, such as 27 MHz or 60 MHz. If a dual-frequency RF power is used to generate the plasma, a mixed RF power may be used. The mixed RF power may provide a high frequency power in a range from about 10 MHz to about 60 MHz, for example, about 13.56 MHz, 27 MHz or 60 MHz, as well as a low frequency power in a range of from about 10 KHz to about 1 MHz, for example, about 350 KHz. Electrode spacing, i.e., the distance between a substrate and a showerhead, may be from about 200 mils to about 1000 mils, for example, from about 280 mils to about 300 mils spacing.

The process range as discussed herein provides a deposition rate for a nitrogen doped amorphous carbon layer in the range of about 10 Å/min to about 30,000 Å/min. One skilled in the art, upon reading the disclosure herein, can calculate appropriate process parameters in order to produce a nitrogen doped amorphous carbon film of different deposition rates. The as-deposited nitrogen-doped amorphous carbon layer has an adjustable carbon:nitrogen ratio that ranges from about 0.1% nitrogen to about 10% nitrogen, such as about 2% to about 6%. An example of nitrogen doped amorphous carbon materials deposited by the processes described herein is provided as follows.

Figure 3E:
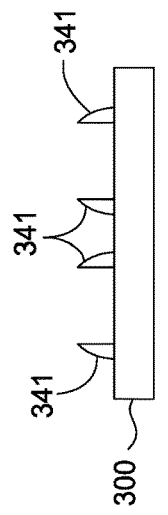
Figure 3D:
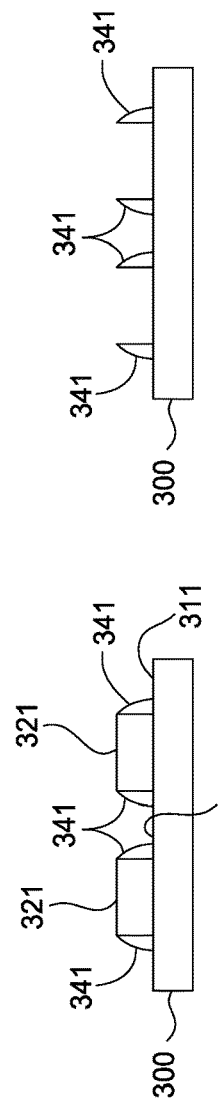

Referring back to FIG. 2, at box 210, after the carbon-based protective layer 340 has been deposited conformally on the patterned features 321 using the novel process discussed at box 208, the carbon-based protective layer 340 is anisotropically etched (a vertical etch) to expose the substrate 300 in areas 311 and expose an upper surface of patterned features 321, resulting in patterned features 321 protected by carbon-based sidewall spacers 341 (formed from the carbon-based protective layer 340), as shown in FIG. 3D.

At box 212, the patterned features 321 are removed using a conventional plasma etching process or other suitable wet stripping process, leaving non-sacrificial carbon-based sidewall spacers 341 as shown in FIG. 3E. The plasma etching process may be performed by bringing the substrate 300 in contact with a plasma generated from a fluorine-based etching chemistry to remove the patterned features 321. Due to the improved material quality and coverage, the carbon-based sidewall spacers 341 are not damaged because they have very good selectivity to the fluorine-based reactive etching chemistry or the wet strip-based chemistry. Upon removal of the patterned features 321, the remaining carbon-based sidewall spacers 341 may be used as a hardmask for etching the underlying layer, layer stack, or structure. The process 200 has been proved to be able to form non-sacrificial carbon-based sidewall spacers 341 with a gap space of about 2.47 nm and a core space of about 2.93 nm.

Other variations of the process are contemplated. For example, instead of using only one spacer material as discussed above in process 200, two different kinds of spacer materials may be used. In such a case, the two spacer materials need to be selective to each other so that one can be removed without affecting the other spacer material. Conformal amorphous carbon deposited in accordance with the inventive process described above can be an ideal candidate for the spacer material for various patterning processes using two spacer materials, such as a self-aligned triple patterning (SATP) process, because amorphous carbon film offers high selectivity to conventional silicon-based materials from both dry and wet strip stand points. Some possible process flows for SATP are as follows: (1) carbon core patterning→1$^{st}$ oxide spacer deposition→1$^{st}$ oxide spacer etch back→conformal carbon spacer deposition-→conformal carbon spacer etch back→removal of 1$^{st}$ oxide spacer; or (2) oxide core patterning→conformal carbon 1$^{st}$ spacer deposition→conformal carbon 1$^{st}$ spacer etch back-→oxide spacer deposition→oxide spacer etch back→removal of 1$^{st}$ carbon spacer. Details of process (1) are discussed below in process 400 and related FIGS. 5A-5H.

Figure 4:
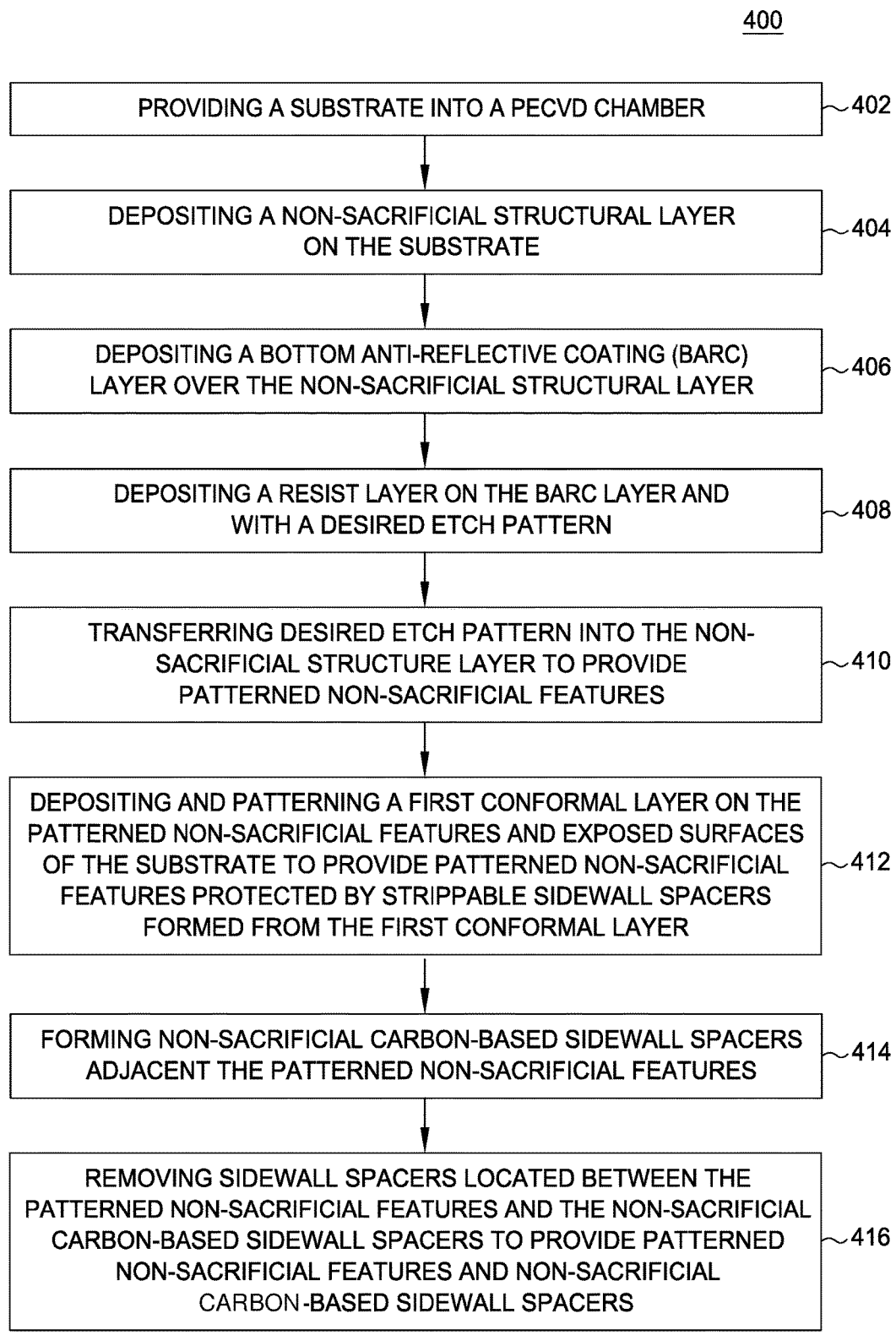
FIG. 4 is a flowchart depicting steps associated with an exemplary patterning process according to another embodiment of the disclosure.

FIG. 4 is a flowchart depicting steps associated with an exemplary patterning process using two different spacer materials according to another embodiment of the disclosure. FIGS. 5A-5H illustrate cross-sectional views of a structure formed by the steps set forth in FIG. 4. Similarly, the concept of this embodiment is equally applicable to other patterning processes such as a self-aligned double patterning (SADP) process, a self-aligned triple patterning (SATP) process, a self-aligned quadruple patterning (SAQP) process, a via/hole shrink process, a back end of line (BEOL), etc., that may require the use of protective spacer or protective sacrificial layer, as needed in various semiconductor processes such as NAND flash application, DRAM application, or CMOS application, etc.

The process 400 starts at box 402 by providing a substrate 500 into a processing chamber, such as a PECVD chamber. The substrate 500 may be one or more materials used in forming semiconductor devices including a silicon material, an oxide material, a polysilicon material, or the like, as discussed above with respect to substrate 300 shown in FIG. 3A.

At box 404, a non-sacrificial structural layer 520 is deposited on the substrate 500 as shown in FIG. 5B. The non-sacrificial structural layer 520 may be a carbon-based material such as amorphous carbon. In one example, the carbon-based material is amorphous hydrogenated carbon. One exemplary carbon-based material that can be used as the sacrificial structural layer 520 is an Advanced Patterning Film™ (APF) material, which is commercially available from Applied Materials, Inc. of Santa Clara, Calif.

At box 406, a bottom anti-reflective coating (BARC) layer 540 is deposited over the non-sacrificial structure layer 520. The BARC layer 540 may be an organic material such as polyamides and polysulfones. The BARC layer 540 is believed to reduce reflection of light during patterning of the subsequent resist layer and is also helpful for thinner resist layers because the BARC layer 540 increases the total thickness of the multi-layered mask for improved etch resistance during etch of underlying layer or structure. In some embodiments, a light absorbing layer 530 may be optionally deposited between the BARC layer 540 and the non-sacrificial structure layer 520, as shown in FIG. 5C, to improve photolithography performance. The light absorbing layer 530 may be a metal layer, such as nitrides. In one example, the light absorbing layer 530 is titanium nitride.

At box 408, a resist layer, such as a photoresist material, is deposited on the BARC layer 540. The resist layer is then patterned by a lithographic process to form a patterned resist layer 550 with a desired etch pattern 551, as shown in FIG. 5D. The etch pattern 551 may have different pattern width, depending upon the application.

At box 410, the BARC layer 540, the light absorbing layer 530, and the non-sacrificial structure layer 520 are patterned sequentially using conventional photolithography and etching processes to transfer the desired etch pattern 551 into the non-sacrificial structure layer 520, leaving patterned non-sacrificial features 521, as shown in FIG. 5E.

At box 412, a first conformal layer is deposited conformally or substantially conformally on the patterned non-sacrificial features 521 (formed from the non-sacrificial structural layer 520) and the exposed surfaces of the substrate 500. The first conformal layer may comprise a strippable material having an etching rate different from the patterned sacrificial features 521. Suitable materials for the first conformal layer may include, for example, oxides such as silicon dioxide, silicon oxynitride, or nitrides such as silicon nitride. The first conformal layer is then anisotropically etched to expose the substrate 500 in areas 511 and expose an upper surface of patterned non-sacrificial features 521, resulting in patterned non-sacrificial features 521 protected by strippable sidewall spacers 561 formed from the first conformal layer, as shown in FIG. 5F.

At box 414, non-sacrificial carbon-based sidewall spacers 571 are formed adjacent or in contact with the patterned non-sacrificial features 521. The non-sacrificial carbon-based sidewall spacers 571 may be formed by depositing a conformal layer of a carbon-based material, such as an amorphous carbon, either doped or undoped, on the substrate, covering exposed surfaces of patterned non-sacrificial features 521, strippable sidewall spacers 561 and the substrate. The conformal amorphous carbon is deposited at least on top of the strippable sidewall spacers 561 such that this acts as a protective layer during the subsequent spacer etch-back process. The thickness of the conformal amorphous carbon may be chosen based on integration requirements, typically between 10 Å and 200 Å. Having excellent conformality (>95%) is important to ensure that the sidewall of the strippable sidewall spacers 561 is covered adequately even with a very thin layer of carbon film (i.e. <50 Å).

In one example, the conformal layer of amorphous carbon is doped with nitrogen using the hydrocarbon compounds and processes described above with respect to boxes 208 and 210. The amorphous carbon layer, when deposited using novel process conditions as discussed above (boxes 208), will achieve step coverage of at least about 80% or more, for example about 100% or more, such as 120%.

The deposited conformal layer of amorphous carbon is then anisotropically etched to expose surfaces of the substrate 500 in areas 511 and expose upper surfaces of patterned non-sacrificial features 521 and strippable sidewall spacers 561, resulting in patterned non-sacrificial features 521 protected by strippable sidewall spacers 561 formed from the first conformal layer and non-sacrificial carbon-based sidewall spacers 571 adjacent or in contact with strippable sidewall spacers 561, as shown in FIG. 5G.

At box 416, the strippable sidewall spacers 561, located between the patterned non-sacrificial features 521 and the non-sacrificial carbon-based sidewall spacers 571, are removed using a conventional wet stripping process or other suitable etching process, leaving patterned non-sacrificial features 521 and non-sacrificial carbon-based sidewall spacers 571 as shown in FIG. 5H. The remaining patterned non-sacrificial features 521 and non-sacrificial carbon-based sidewall spacers 571 may then be used as a hardmask for etching the underlying layer, layer stack, or structure. Particularly, the density of the resulting hardmask (i.e., patterned non-sacrificial features 521 and non-sacrificial carbon-based sidewall spacers 571) in accordance with this patterning process is triple that of the patterned non-sacrificial features 521, and the pitch of resulting hardmask (i.e., patterned non-sacrificial features 521 and non-sacrificial carbon-based sidewall spacers 571) is half the pitch of the patterned non-sacrificial features 521.

Carbon-based protective layers or carbon-based sidewall spacers deposited in accordance with the present disclosure have been observed to be able to provide excellent conformality higher than 95% with improved film properties, as shown below in Table 2, as compared to the conventional ALD grown spacers using silicon oxide materials. Since the sidewalls of hard mask spacers are not damaged during the ashing or anisotropic plasma etching process, the line edge roughness is significantly reduced. Therefore, the resulting hard mask spacers can provide superior etch profile and etch selectivity with little or no microloading. Table 1 below shows film properties of an amorphous carbon film deposited using the process conditions described above with respect to box 208.

TABLE 1

| | |
|---|---|
| Uniformity (R/2, %) | ~1.5% |
| Refractive Index (633 nm) | 1.7-1.9 |
| Absorption Coefficient (633 nm) | 0.01-0.3 |
| Film Density (g/cc) | 1.25-1.70 |
| Stress (MPa) | −100 to +100 |
| Hardness (GPa) | 2.5 |
| Modulus (GPa) | 20 |
| Step Coverage (%) | >100 |
| Micro-loading (%) | <3 |
| Etch Selectivity to Poly | 2.2 |

Conformal amorphous carbon layers deposited in accordance with the present disclosure may be used in various applications, such as contact CD (critical dimension) shrink process flow (for mask open, via etch etc.) at high temperatures (>300° C.) or low temperatures (<200° C.) for small CD requirement in 65 nm or beyond technology (e.g., 45 nm or even 32 nm node technology in the future), CD control of high aspect ratio in 3D NAND structure of oxide-nitride and oxide-polySi stacks, gap fill at high temperatures (>300° C.) for self-aligned double patterning (SADP).

While the foregoing is directed to embodiments of the present disclosure, other and further embodiments of the disclosure may be devised without departing from the basic scope thereof, and the scope thereof is determined by the claims that follow.

The invention claimed is:

1. A method of forming a conformal amorphous carbon layer on a substrate in a processing chamber, comprising:
   depositing a dielectric layer on a substrate;

depositing a sacrificial dielectric layer on an upper surface of the dielectric layer;

forming a pattern into the sacrificial dielectric layer by removing portions of the sacrificial dielectric layer to expose portions of the upper surface of the dielectric layer;

introducing a hydrocarbon source, a plasma-initiating gas, and a dilution gas into the processing chamber, wherein a volumetric flow rate of hydrocarbon source:plasma-initiating gas:dilution gas is in a ratio of 1:0.5:20;

generating a plasma in the processing chamber to deposit a conformal amorphous carbon layer on the portions of the upper surface of the dielectric layer and on remaining portions of the sacrificial dielectric layer;

selectively removing the amorphous carbon layer using an anisotropic etching process to expose upper surfaces of the remaining portions of the sacrificial dielectric layer and to expose the upper surface of the dielectric layer; and removing the remaining portions of the sacrificial dielectric layer.

2. The method of claim 1, further comprising:
introducing a nitrogen-containing gas into the processing chamber.

3. The method of claim 2, wherein the nitrogen-containing gas is introduced at a nitrogen-containing gas to a hydrocarbon source ratio of about 1:40 to about 10:1.

4. The method of claim 1, wherein the plasma is generated in the processing chamber at a deposition temperature of about 200° C. or less.

5. The method of claim 1, wherein the hydrocarbon compound comprises acetylene ($C_2H_2$), ethylene ($C_2H_4$), ethane ($C_2H_6$), propylene ($C_3H_6$), propyne ($C_3H_4$), propane ($C_3H_8$), butane ($C_4H_{10}$), butylene ($C_4H_8$), butyne ($C_4H_6$), phenylacetylene ($C_8H_6$), or combinations thereof.

6. The method of claim 1, wherein the hydrocarbon source is a nitrogen-containing hydrocarbon source.

7. The method of claim 6, wherein the nitrogen-containing hydrocarbon source is described by the formula CxHyNz, where x has a range of between 1 and 12, y has a range of between 2 and 20, and z has a range of between 1 and 10.

8. The method of claim 7, wherein the nitrogen-containing hydrocarbon source comprises one or more nitrogen containing hydrocarbon compounds selected from the group consisting of methylamine, dimethylamine, trimethylamine (TMA), triethylamine, aniline, quinoline, pyridine, acrylonitrile, benzonitrile, and combinations thereof.

9. The method of claim 1, wherein the amorphous carbon layer is a nitrogen-doped amorphous carbon having a carbon:nitrogen ratio of between about 0.1% nitrogen to about 10% nitrogen.

* * * * *